United States Patent [19]

de Leeuw

[11] 4,079,460
[45] Mar. 14, 1978

[54] DEVICE OPERATING WITH THE DISPLACEMENT OF MAGNETIC DOMAIN WALLS

[75] Inventor: Franciscus Hermanus de Leeuw, Eindhoven, Netherlands

[73] Assignee: U.S. Philips Corporation, New York, N.Y.

[21] Appl. No.: 682,982

[22] Filed: May 3, 1976

Related U.S. Application Data

[63] Continuation of Ser. No. 463,732, Apr. 24, 1974, abandoned, which is a continuation-in-part of Ser. No. 455,796, Mar. 28, 1974, abandoned.

[30] Foreign Application Priority Data

| | | |
|---|---|---|
| Apr. 25, 1973 | Netherlands | 7305753 |
| Oct. 26, 1973 | Netherlands | 7314730 |
| Apr. 5, 1974 | Netherlands | 7404660 |

[51] Int. Cl.² ............................................. G11C 19/08
[52] U.S. Cl. .................................................... 365/25
[58] Field of Search .................................. 340/174 TF

[56] References Cited

U.S. PATENT DOCUMENTS

| | | | |
|---|---|---|---|
| 3,876,994 | 4/1975 | Calhoun | 340/174 TF |
| 3,942,165 | 3/1976 | de Leeuw | 340/174 TF |

FOREIGN PATENT DOCUMENTS

| | | | |
|---|---|---|---|
| 2,418,839 | 10/1974 | Germany | 340/174 TF |

*Primary Examiner*—James W. Moffitt
*Attorney, Agent, or Firm*—Frank R. Trifari; Carl P. Steinhauser

[57] ABSTRACT

A device operating with the displacement of magnetic domain walls and comprising a layer of a magnetizable material having an easy axis of magnetization perpendicular to the plane of the layer, in which layer magnetic domain walls can be produced, maintained and moved, as well as a device to cause a magnetic propulsive field to act upon magnetic domains present in the layer so as to move them between previously determined positions. In order to obtain maximum speeds, the propulsive field acting upon a domain wall during the movement should at any instant have a value which is below the value for which a drop occurs in the function which characterizes the magnetizable material and which represents the relation between the propulsive field and the speed.

5 Claims, 10 Drawing Figures

DEVICE OPERATING WITH THE DISPLACEMENT OF MAGNETIC DOMAIN WALLS

This application is a continuation of Ser. No. 463,732, filed Apr. 24, 1974, now abandoned which is a continuation-in-part application of Ser. No. 455,796, filed Mar. 28, 1974, now abandoned.

The invention relates to a device operating with the displacement of magnetic domain walls and comprising a layer of a magnetizable material having an easy axis of magnetization perpendicular to the plane of the layer, a device to produce and maintain magnetic domain walls in the layer, as well as a device to cause a magnetic propulsive field to act upon magnetic domains present in the layer so as to move them between previously determined positions.

A field of application for devices of this type are, for example, data processing systems, and notably devices in which magnetizable media in which magnetic domain walls can be moved, are used for performing logic, display and memory functions. In this connection it is to be noted that both straight magnetic domain walls and, for example, domain walls which are closed in themselves and which form the boundary of so-called magnetic "bubbles", are to be considered.

From the publication "Magnetic bubbles a Technology in the making" *Electronics*, September 1969, p. 83–89, devices are known, for example, in which thin films of a magnetizable material having an easy axis of magnetization perpendicular to the plane of the film are used, in which films single-walled magnetic domains, i.e. magnetic domains which are bounded by a wall closed in itself and which may assume the form of a cylinder, are created. In this case a bias magnetization field having such a strength and polarity is produced that the separate domains can be maintained and be moved as stable units. The displacement of both straight domain walls and domain walls closed in themselves from one position to another can be carried out by means of localized magnetic fields.

A controlled movement of the domain walls is possible by means of a pattern of electric conductors to which currents are supplied in such manner that a domain is moved successively from one point to another along a previously determined track.

Another possibility for a controlled movement of domain walls consists of the use of a pattern of permalloy elements which have such a shape that, together with a rotating magnetic field which can be produced by means of electric windings provided around the above-mentioned device, they force the domains to move in a given direction.

In particular for use in data processing systems it is a requirement that the rate of movement of the magnetic domain walls is so high that the same bit rates are realizable as are achievable with electronic data processing systems.

In devices for the movement of domain walls as described above it might be expected that an increase of the force on the wall in the initial position results in a larger speed of the domain wall during its movement to the next position. However, investigations performed by applicants have provided that in particular in ferromagnetic materials having a garnet structure which are suitable for use in data processing systems as described above, a sudden drop of the speed occurs above a given critical force on the domain wall, at which force the speed of the domain wall is maximum.

It is an object of the present invention to provide a device operating with the displacement of magnetic domain walls, in which the domain walls are moved at the highest possible speed.

For that purpose, the device according to the invention is characterized in that the propulsive field acting upon a domain wall during the movement has at any instant a value which is below the value for which a drop occurs in the function which characterizes the magetizable material and which represents the relation between the propulsive field and the speed.

The operation of the device according to the invention is based on the fact that the force on the domain wall is maintained just below said critical force. The speed at which the wall moves under this condition is the maximum achievable speed. It may occur that the distance which the wall is to cover to reach its next position is so large that, although having been started at its maximum speed, it starts running less and less rapidly. In order to cause the wall to move at a constant maximum speed between its initial and final positions, the variation in time of the applied field should be chosen to such that the force on the wall during the movement from the initial to the final position is substantially constant. In this manner it is achieved that the domain wall covers its track in a minimum period of time.

For that purpose, according to a preferred embodiment of the inventive device a succession of magnetic fields for displacing a domain wall between two successive positions is applicable with such an increasing field strength that the speed of the wall is substantially constant.

According to a further preferred embodiment of The inventive device means are present to cause a magnetic auxiliary field to act upon the layer of magnetizable material with a field direction which lies in the plane of the layer. It has been found that a considerable higher speed of the domain walls is possible by applying an auxiliary field in the plane of the layer, while in addition the operation range can be increased as will be described in detail hereinafter.

The invention will be described in greater detail with reference to the drawing.

Figure 1:
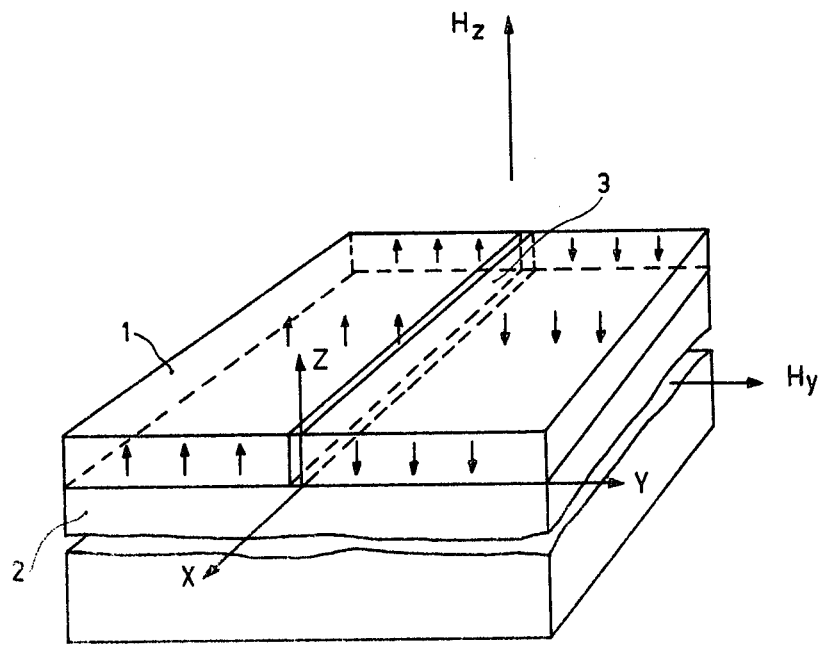
FIG. 1 shows a thin film of magnetizable material in which a domain wall is present.
Figure 2:
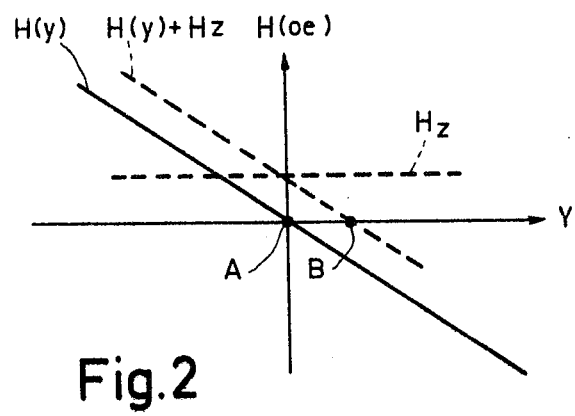
FIG. 2 shows the variation in the v-direction of the magnetic field in the z-direction in which the film shown in FIG. 1 is present.
Figure 3:
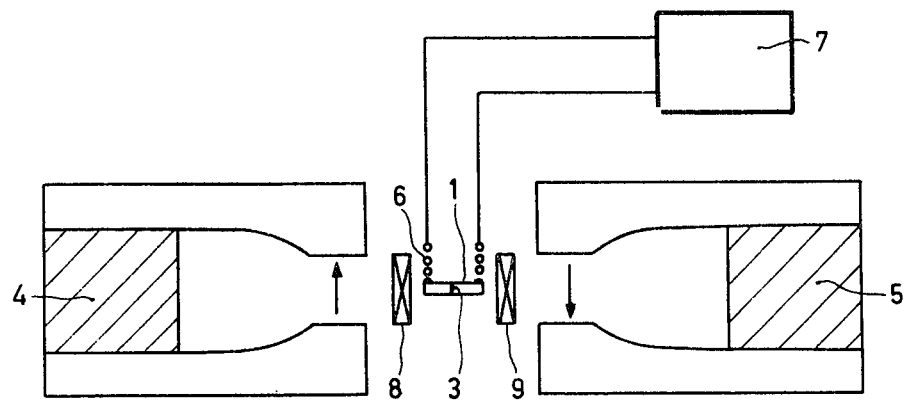
FIG. 3 shows a device for the displacement of domain walls.

FIG. 1 shows a thin film 1 of a magnetizable material having an easy axis of magnetization perpendicular to the plane of the film. In the present case this was a gallium-substituted yttrium-iron garnet film with a thickness of 3.9 μm. The film has been growth on a substrate 2 of gadolinium gallium garnet by means of epitaxy from the liquid phase. Present in the film 1 is a domain wall 3 formed by supplying a magnetic field H(z) perpendicularly to the plane of the film, of which field the field strength shows a gradient in the y-direction (FIG. 2). The gradient field H(y) is produced by means of the permanent magnets 4 and 5 which produce oppositely directed fields (FIG. 3). The strength of said gradient field is maximum 6 kOe/cm. As a result of this a domain wall 3 is created in the film 1. A static magnetic auxiliary field $H_y$ which is perpendicular to the domain wall 3 is produced either by means of the electric windings 8 and 9, or by placing the film not accuratly symmetrically retative to the magnets 4 and 5. The strength of said auxiliary field is a few hundred Oersteds. By means of the electric winding 6 which is connected to a pulse generator 7 a pulsatory propulsive field $H_z$ (rise time 8 ns, recurrence frequency 100 kHz) is produced. The maximum strength of the produced field is 16 Oe. Under the influence of the fields H(y) and $H_z$ the wall 3 moves from the -stable- position A to the -stable- position B (FIG. 2).

Figure 4:
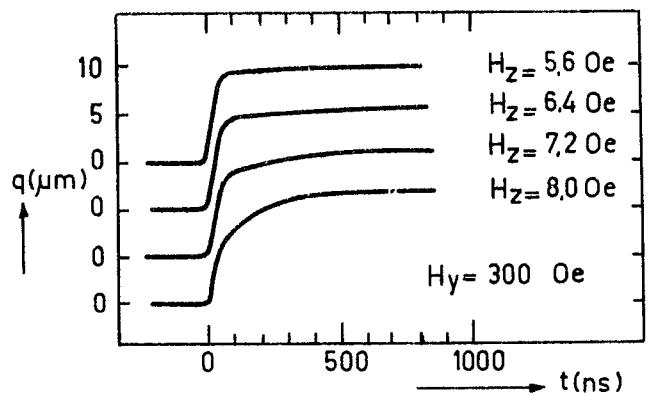
FIG. 4 shows the wall position $q$ as a function of the time $t$ at different values of the propulsive field $H_z$ and an auxiliary field $H_y$ of 300 Oe.
Figure 5:
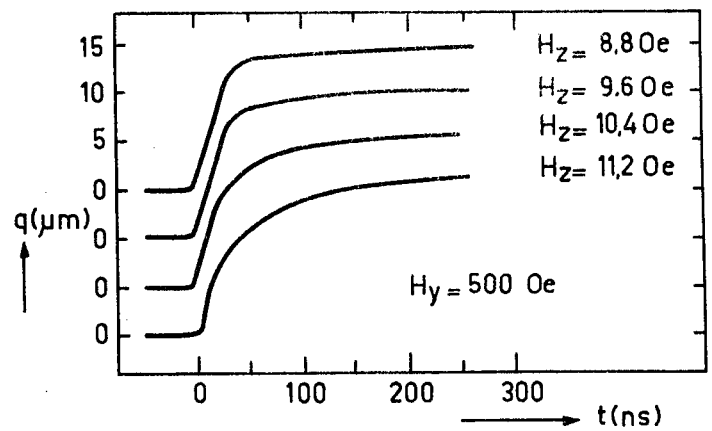
FIG. 5 shows the wall position $q$ as a function of the time $t$ at different values of the propulsive field $H_z$ and an auxiliary field $H_y$ of 500 Oe.
Figure 6:
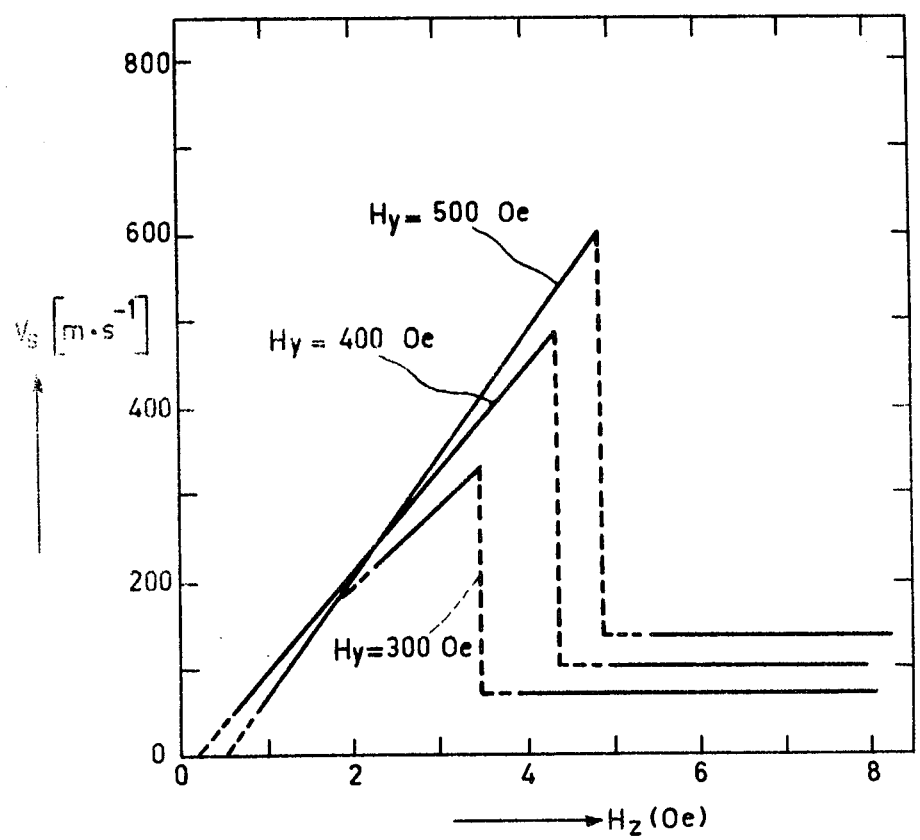
FIG. 6 shows the wall speed $V_s$ as a function of different values of the driving field $H_z$ at different values of the axuiliary field $H_y$.

By means of a polarizer, an analyzer and a photomultiplier, the intensity variation caused by the Faraday effect of a light beam passing through the film 1 is detected. The detection signal is suppied to an oscilloscope and calibrated in terms of wall displacement by comparison with a direct observation of the wall displacement by means of a polarization microscope. From this experiment curves are obtained which show the place of the wall as function of time. A number of these curves are shown in FIG. 4 which shows the wall position q as a function of th time t at different values of the propulsive field $H_z$ and with an auxiliary field $H_y$ of 300 Oe. FIG. 5 shows a number of curves which represent the wall position q as a function of the time t at different values of the propulsive field and with an auxiliary field $H_y$ of 500 Oe. By determining the slopes of these curves, the speed of the wall under different conditions can be found. A theoretical curve may now be produced which fits in as readily as possible with the experimental situation. This curve permits finding the point at which the speed during the movement is maximum (= constant). Calculating back, the associated field can then be found. Via this process FIG. 6 has been made which indicates the stationary speed $V_s$ as a function of the strength of the propulsive field $H_z$ at different values of the auxiliary field $H_y$. It appears from the figure that the wall achieves a maximum speed of 610 m/s with a strength of the propulsive field of 5 Oe and with a strength of the auxiliary field $H_y$ of 500 Oe. In the case of larger propulsive fields the speed of the wall proves to decrease to a value which is independent of the strength of the propulsive field, in this case 130 m/s.

For auxiliary fields $H_y$ with a field strength lower than 500 Oe the maximum achievable speed proves to be smaller. Moreover it appears that said maximum speed is achieve at a lower value of the propulsive field $H_z$. This means that the operational range, that is the range of values of the applied fields for which the speed of the domain wall increases when the field increases, is larger according as the strength of the auxiliary field is higher.

Figure 7:
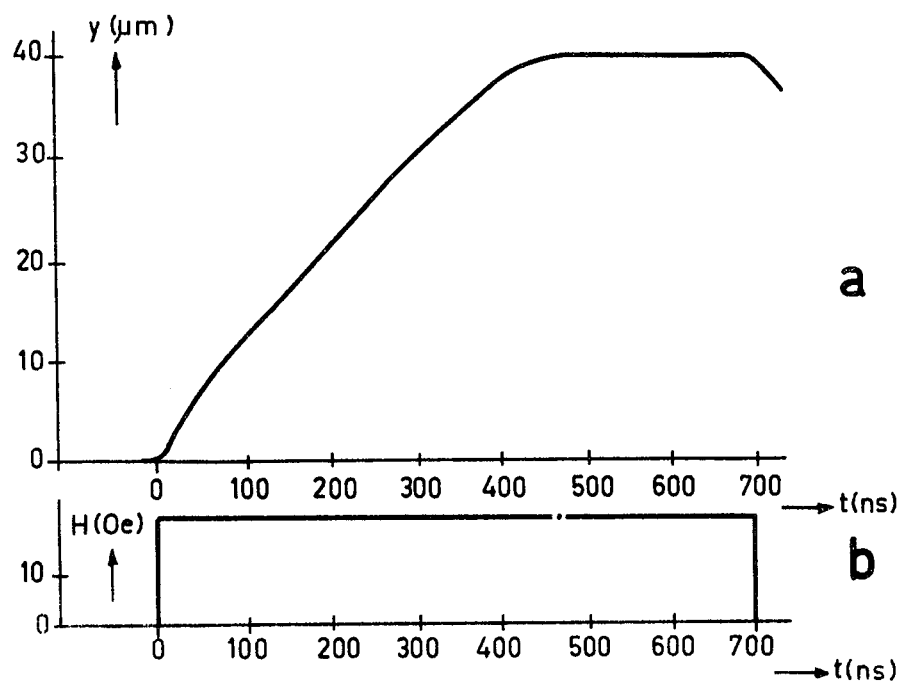
FIG. 7 shows how a domain wall in the film of FIG. 1 moves in time under the influence of a pulsatory field with constant strength.

FIG. 7a shows how the wall 3 displaces in time under the influence of an applied field pulse with a pulse width of 700 nanoseconds, a rise time of 14 nanoseconds and an amplitude of 16 Oe (FIG. 7b). In these circumstances the wall proves to cover a distance of 40 μm in approximately 400 nanoseconds.

Figure 8:
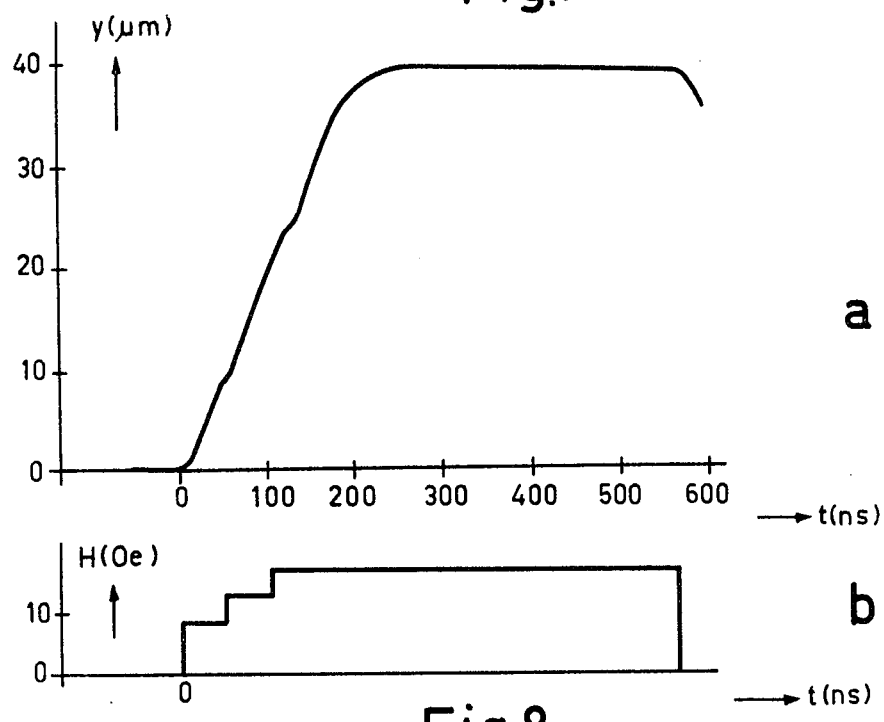
FIG. 8 shows how a domain wall in the film of FIG. 1 moves in time under the influence of a pulsatory field increasing in strength.

FIG. 8a shows how the wall 3 displaces in time under the influence of an applied field pulse increasing in strength (FIG. 8b). During the first 50 nanoseconds, the field amplitude is 6 Oersted, the subsequent 50 nanoseconds the field is increased to 12 Oersted and the subsequent 500 nanoseconds to 16 Oersted. In these circumstances the wall proves to cover the distance of 40 μm in approximately 200 nanoseconds, which means that the speed is twice as large as in the case of FIG. 7. Moreover it may be seen that due to the chosen increase of the field strength of the applied field the speed of the wall is maintained substantially constant.

Figure 9:
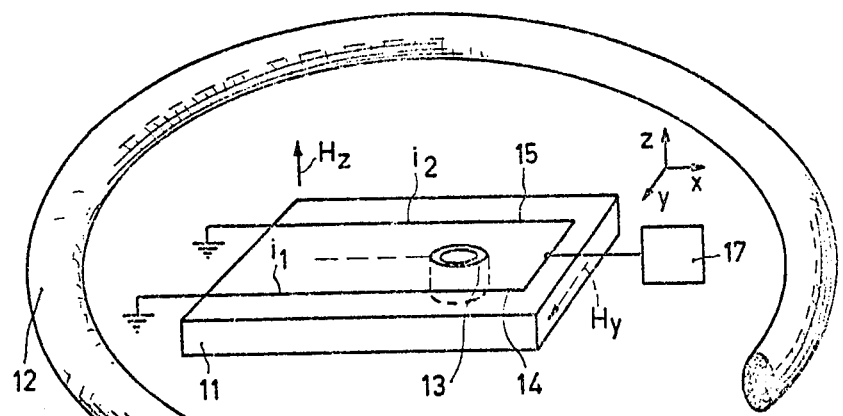
FIG. 9 shows a device for the displacement of domain walls which are closed in themselves.

The displacement of domain walls closed in themselves and forming the boundary of magnetic "bubbles" will be explained with reference to FIGS. 9 and 10.

A thin film 11 of a magnetizable material having an easy axis of magnetisation perpendicular to the plane of the film is placed in a magnetic field $H_z$ which is perpendicular to the plane of the film (FIG. 9) and is produced by means of the electric winding 12. In the present case—but the invention is not restricted to this case—this was a 4.5 μm thick film of gallium-substituted yttrium-iron garnet. This material is characterized by a magnetisation 4 πM = 78 Gauss and a damping constant α = 0.007. An auxiliary field $H_y$ having a strength of a few hundreds of Oersteds can be produced in the plane of the film 1 by means of magnets (not shown). A magnetic "bubble" 13 is produced in the film in the following manner. The field $H_z$ is given a strength of 20 Oersted. Under the influence hereof, strip-shaped domains are formed which extend in the direction y. A current pulse is conveyed through the conductors 14 and 15 which are connected to the pulse generator 17, as a result of which high fields are produced at the area of the conductors 14 and 15 and the domains divided into two parts. Insulated strip-shaped domains remain between the conductors. By increasing the field $H_z$ to 27 Oersted, said insulated domains contract to "bubbles". By adjusting the currents through the conductors 14 and 15, such a gradient field is produced that the "bubble" 13 is moved to a position centrally between the conductors (zero position). (By causing the "bubble" 13 to reciprocate a few times in the gradient field, possibly other "bubbles" present are moved towards the conductors and are annihilated there.) The position of the "bubble" 13 is observed via a polarisation microscope with a measuring ocular. In the present case, the diameter of the "bubble" 13 was 7.2 μm. The "bubble" 13 was moved from different starting positions (which had different distances to the zero position but were present on the same side) by cutting in currents $i_1$ and $i_2$ for short times t, to be adjusted by means of the pulse generator 17. In the present case, the pulse duration was always 25 nanoseconds. The different starting positions were chosen to realize propulsive fields ΔH of different strengths at the beginning of the "bubble" movement. The displacement was repeated a number of times for each starting position. The "bubble" 13 was always returned to the relevant starting position by reversing the polarity of the currents $i_1$ and $i_2$.

Figure 10:
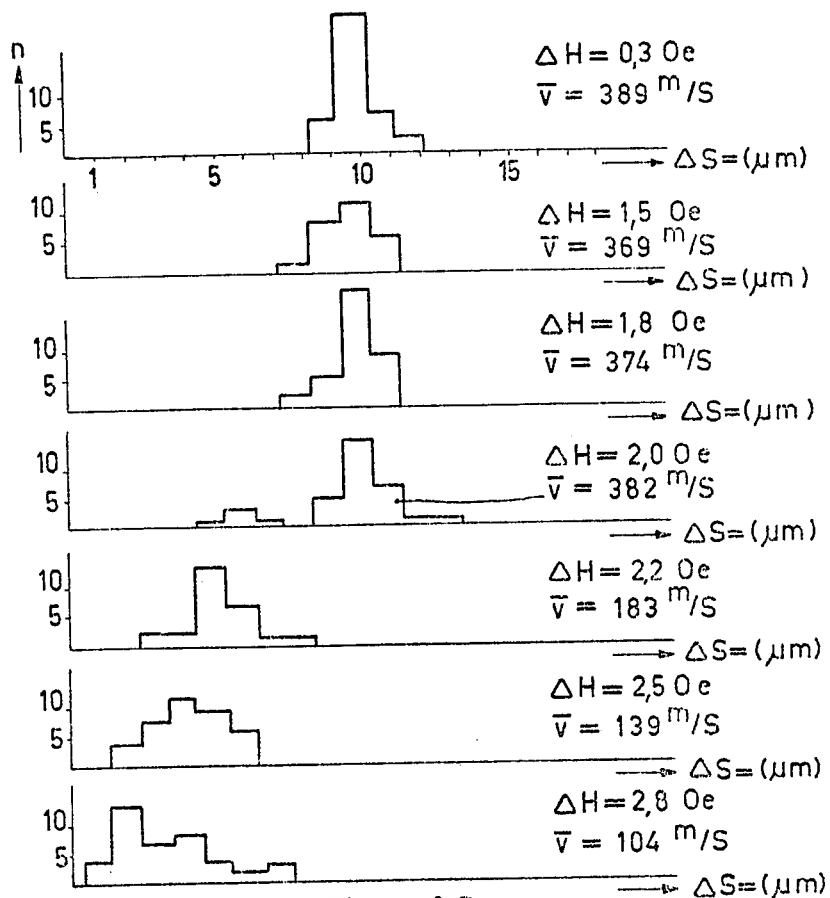
FIG. 10 shows the distance covered by a domain wall under the influence of different propulsive fields.

The measured results obtained via the above described process are shown in FIG. 10.

For 7 different starting positions, the distance $\Delta s$ (measured by means of the measuring ocular) covered by the "bubble" 13 is plotted on the horizontal, and the number of times $n$ that the "bubble" 13 covered a given distance is plotted on the vertical. The average speed $\bar{v} = \Delta S/t$ is also stated in each of the cases. The strength of the field $H_y$ was 185 Oersted. It is obvious that with propulsive fields of a strength from 2.0 Oersted, shorter covered distances (so lower speeds) start occurring. The critical field strength is here 2.0 Oersted ± 0.2.

A second measurement was carried out in which the strength of the auxiliary field $H_y$ was 285 Oersted. It was found that in these circumstances with propulsive fields $\Delta H$ even of 2.8 Oersted no lower speeds occurred. So in this case the critical field strength is higher than 2.8 Oersted.

As is the case with straight walls, there is hence a relation in walls which are closed in themselves between the critical field strength $H_{Kr}$ and the strength of the auxiliary field $H_h$. For this relation it holds to a good approximation that: $H_{Kr} = 2^\pi \cdot \alpha \cdot H_h$, wherein $\alpha$ is the damping constant of the material. When using stronger auxiliary fields, the maximum speed also increases. In the first measurement ($H_y = 185$ Oersted), a maximum speed of approximately 400 m/s was measured, in the second measurement ($H_y = 285$ Oersted) a maximum speed of approximately 650 m/s was measured.

What is claimed is:

1. A device operating with the displacement of magnetic domain walls and comprising a layer of a magnetizable material having an easy axis of magnetization perpendicular to the plane of the layer, means to produce and maintain magnetic domain walls in the layer, means to produce a substantially homogeneous magnetic gradient field over a distance greater than the domain wall thickness to move magnetic domain walls present in the layer between selected positions, said gradient field having a direction substantially normal to the plane of the layer and having at any instant a field strength which is below the field strength for which a drop occurs in the propulsive field strength versus domain wall speed curve of the layer, but which is above the field strength with which domain walls are moved at saturation speed.

2. A device as claimed in claim 1, further including means to produce a magnetic auxiliary field to influence the layer which field has a field direction which lies in the plane of the layer.

3. A device as claimed in claim 1 further including means for producing a succession of magnetic fields for the displacement of a domain wall between two successive positions of such field strength that the speed of the wall is substantially constant.

4. A device as claimed in claim 1, wherein the layer consists of a ferromagnetic material having a garnet structure.

5. A device as claimed in claim 4, wherein the layer consists of gallium-substituted yttrium-iron garnet.

* * * * *